(12) United States Patent
Coppinger et al.

(10) Patent No.: US 6,466,028 B1
(45) Date of Patent: Oct. 15, 2002

(54) TRAILER TETHER SENSOR CIRCUIT

(75) Inventors: James B. Coppinger, Chattanooga; Kevin R. DeBinder, Caryville, both of TN (US)

(73) Assignee: Transcommunications, Inc., Chattanooga, TN (US)

( * ) Notice: Subject to any disclaimer, the term of this patent is extended or adjusted under 35 U.S.C. 154(b) by 0 days.

(21) Appl. No.: 09/840,362

(22) Filed: Apr. 23, 2001

(51) Int. Cl.[7] .......................... G01R 31/02; G01R 31/08

(52) U.S. Cl. .......................... 324/504; 324/609; 340/431

(58) Field of Search ................................ 324/504, 503, 324/98, 522, 605, 609; 340/431, 458, 428

(56) References Cited

U.S. PATENT DOCUMENTS

| | | |
|---|---|---|
| 3,737,767 A | 6/1973 | Slutsky |
| 4,127,855 A | 11/1978 | Toner |
| 4,430,637 A | 2/1984 | Koch-Dücker et al. |
| 4,737,763 A | 4/1988 | Defino et al. |
| 4,743,888 A | 5/1988 | Hilpert et al. |
| 4,897,642 A | 1/1990 | DiLullo et al. |
| 5,025,253 A | 6/1991 | DiLullo et al. |
| 5,095,276 A | 3/1992 | Nepil |
| 5,604,439 A | 2/1997 | Walkington et al. |
| 5,917,433 A | 6/1999 | Keillor et al. |
| 6,373,260 B1 * | 4/2002 | Weller et al. ............... 324/603 |

* cited by examiner

Primary Examiner—N. Le
Assistant Examiner—Vincent Q. Nguyen
(74) Attorney, Agent, or Firm—Luedeka, Neely & Graham, P.C.

(57) ABSTRACT

A sensor circuit detects whether an electrical connection exists between a tractor portion and a trailer portion of a tractor/trailer vehicle. The circuit includes a first chassis electrical ground in the tractor portion and a second vehicle chassis ground in the trailer portion. A first electrical conductor, such as a wire in an umbilical cable, is coupled to the first chassis electrical ground, preferably through a tractor appliance circuit, such as a turn indicator light circuit in the tractor portion. A second electrical conductor, such as a contact in a connector on the trailer portion which mates with the umbilical cable, is operable to electrically connect to and disconnect from the first electrical conductor. The circuit includes a detection circuit for providing an indication signal based upon whether an electrical connection exists between the first electrical conductor and the second electrical conductor. The detection circuit includes a detection diode having an anode which is electrically connected to the second electrical conductor, where the anode has an anode voltage thereon. The diode has a cathode which is electrically coupled to the second vehicle chassis ground, preferably through a trailer appliance circuit, such as a turn indicator light circuit in the trailer portion. The detection circuit also includes a biasing-current source for providing a forward biasing current to the anode of the diode. The detection circuit further includes a comparison circuit for providing an output signal indicative of a voltage level at the anode of the diode, where the voltage level at the anode of the diode is dependent at least in part upon whether an electrical connection exists between the first electrical conductor and the second electrical conductor.

24 Claims, 4 Drawing Sheets

TRAILER TETHER SENSOR CIRCUIT

TECHNICAL FIELD

The present invention is generally directed to monitoring whether a trailer portion of a tractor/trailer rig is connected to the tractor portion. More particularly, the invention is directed to a system for sensing whether an electrical umbilical cable or tether is connected or disconnected between the tractor portion and the trailer portion.

BACKGROUND OF THE INVENTION

Hundreds of thousands of tractor/trailer rigs travel the roadways hauling cargo from one location to another. Often, when a tractor/trailer rig has reached its destination, the trailer is disconnected from the tractor for unloading. The tractor may then be connected to another trailer for transport to another destination. To keep track of the status of individual trailers, monitoring systems have been developed which attach to the trailer for sensing various conditions of the trailer and for transmitting signals to a central location to indicate the condition of the trailer.

One of the conditions typically monitored by such systems is whether or not the trailer is attached to the tractor. Previous systems developed to monitor the connect/disconnect status of a trailer have been unnecessarily complicated, difficult to implement, and/or unreliable.

What is needed, therefore, is a simple and reliable system for detecting the connect/disconnect status of the tractor and trailer portions of a tractor/trailer rig, and for transmitting a signal that is indicative of the connect/disconnect status.

SUMMARY OF THE INVENTION

The foregoing and other needs are met by an apparatus for detecting whether an electrical connection exists between a first vehicle portion and a second vehicle portion of a multi-portion vehicle. The apparatus includes a first chassis electrical ground in the first vehicle portion and a second vehicle chassis ground in the second vehicle portion. A first electrical conductor, such as a wire in an umbilical cable, is coupled to the first chassis electrical ground, preferably through a first appliance circuit, such as a turn indicator light circuit in the first vehicle portion. A second electrical conductor, such as a contact in a connector on the second vehicle portion which mates with the umbilical cable, is operable to electrically connect to and disconnect from the first electrical conductor. The apparatus also includes a detection circuit for providing an indication based upon whether an electrical connection exists between the first electrical conductor and the second electrical conductor. The detection circuit includes a diode having an anode which is electrically connected to the second electrical conductor, where the anode has an anode voltage thereon. The diode has a cathode which is electrically coupled to the second vehicle chassis ground, preferably through a second appliance circuit, such as a turn indicator light circuit in the second vehicle portion. The detection circuit also includes a biasing-current source for providing a forward biasing current to the anode of the diode. The detection circuit further includes a comparison circuit for providing an output signal indicative of a voltage level at the anode of the diode, where the voltage level at the anode of the diode is dependent at least in part upon whether an electrical connection exists between the first electrical conductor and the second electrical conductor.

Some preferred embodiments of the invention include a first appliance circuit disposed in the first vehicle portion. The first appliance circuit includes, in series, a first voltage source for supplying a first voltage, a switching device connected to the first voltage source, a first vehicle appliance connected to the switching device, and the first vehicle chassis ground connected to the first vehicle appliance. In these preferred embodiments, the first electrical conductor is connected to the first appliance circuit between the switching device and the first vehicle appliance.

Some embodiments include a first reference voltage source for providing a first reference voltage, and a second reference voltage source for providing a second reference voltage having an amplitude greater than the first reference voltage. In these embodiments, the comparison circuit receives the anode voltage, the first reference voltage, and the second reference voltage, provides the output signal having a first signal indication when the amplitude of the anode voltage is less than the first reference voltage, and provides the output signal having a second signal indication when the amplitude of the anode voltage is between the amplitudes of the first and second reference voltages.

In another aspect, the invention provides a method for detecting whether an electrical connection exists between a first vehicle portion and a second vehicle portion of a multi-portion vehicle. The method includes the steps of sensing a node voltage level on an electrical node coupled to an appliance circuit in the second vehicle portion, and generating an indication signal indicative of a relationship between the node voltage level, a first reference voltage level, and a second reference voltage level. According to the preferred embodiment of the method, the indication signal indicates no electrical connection between the first and second vehicle portions when the node voltage level is greater than the first reference voltage level and less than the second reference voltage level. The indication signal preferably indicates the existence of an electrical connection between the first and second vehicle portions when the node voltage level is less than the first reference voltage level or greater than the second reference voltage level.

BRIEF DESCRIPTION OF THE DRAWINGS

Further advantages of the invention will become apparent by reference to the detailed description of preferred embodiments when considered in conjunction with the drawings, which are not to scale, wherein like reference characters designate like or similar elements throughout the several drawings as follows.

DETAILED DESCRIPTION OF THE PREFERRED EMBODIMENT

Figure 1:
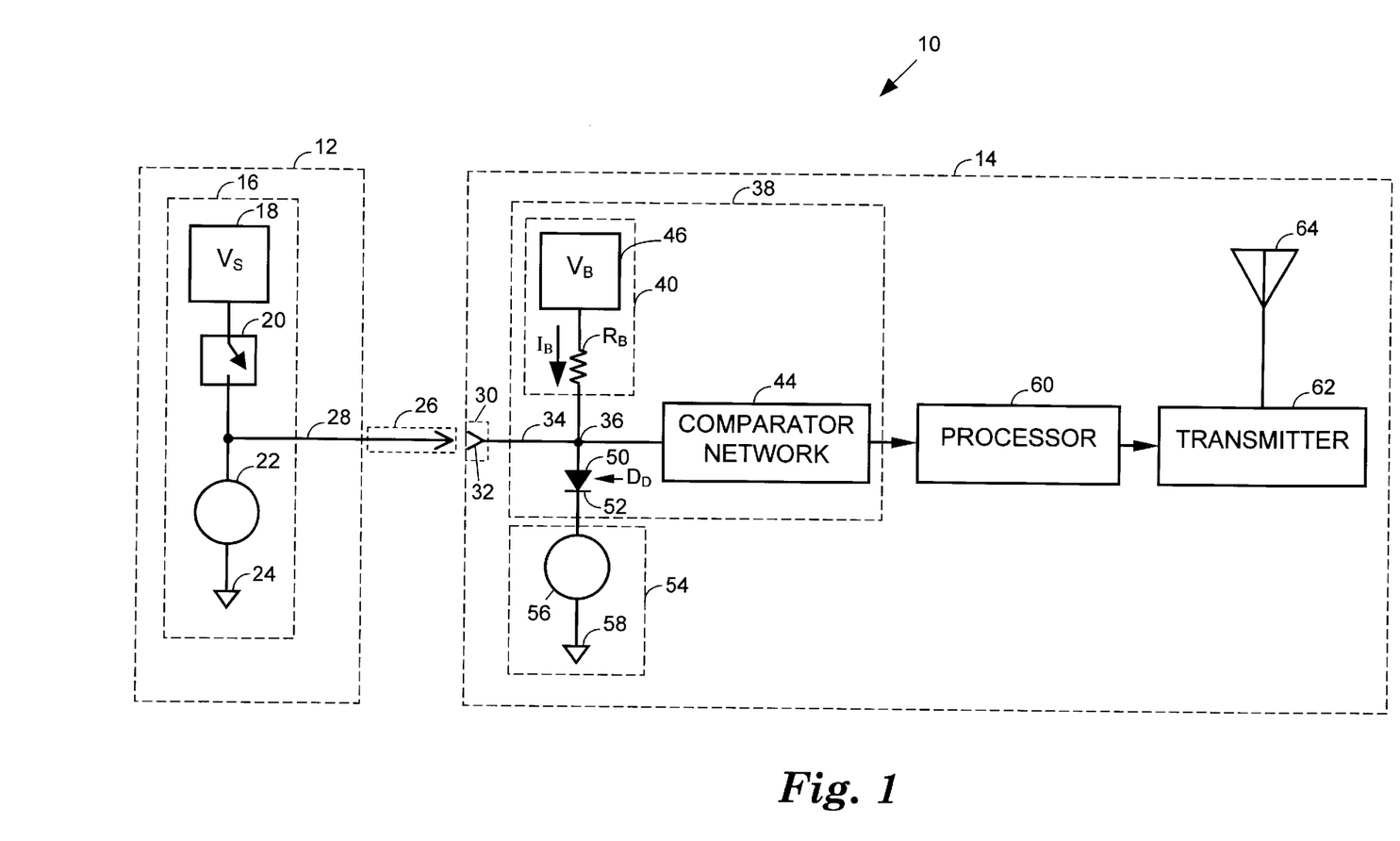
FIG. 1 is a functional block diagram of a preferred embodiment of a system for detecting whether a first vehicle portion is connected to a second vehicle portion.

Shown in FIG. 1 is a system 10 for detecting whether a first vehicle portion, such as a tractor 12, is connected to a second vehicle portion, such as a trailer 14, and for transmitting status signals indicative of the connect/disconnect status. Within the tractor 12 is an appliance circuit, also referred to herein as a first appliance circuit 16, such as a turn indicator light circuit, a brake light circuit, or a marker light circuit. The first appliance circuit 16 preferably includes a switching device 20, such as a mechanical or solid-state relay, and a load or appliance 22, such as the turn indicator lights on the tractor, connected in series between a voltage source 18, such as a 12–13 volt DC battery, and a tractor chassis ground 24.

An umbilical cable 26, also referred to herein as a tether, provides electrical connections between the tractor 12 and the trailer 14. The cable 26 preferably provides at least seven conductors according to SAE standard J560 for ground, left and right turn indicators, brakes, two marker light circuits, and auxiliary power. So as to not overly complicate FIG. 1, only one conductor 28 of the seven is depicted, as only one of the conductors of the cable 26 is needed to implement the invention. In the discussion which follows, the conductor 28 is referred to as the left turn indicator light conductor. However, it will be appreciated that any one of the lighting circuit conductors could be used.

With continued reference to FIG. 1, the cable 26 mates with a connector 30 attached to a junction box on the trailer 14. Preferably, the connector 30 is a standard J560 seven-conductor connector. Within the connector 30 is a contact 32 which makes electrical connection with the conductor 28 when the cable 26 is mated to the connector 30. The contact 32 is electrically connected to a conductor 34.

The conductor 34 is connected to a node 36 of a detection circuit 38. As shown in FIG. 1, the detection circuit 38 generally includes a biasing current source 40, a detection diode $D_D$, and a comparator network 44. In the preferred embodiment of the invention, the biasing current source 40 includes a voltage source 46 for providing a biasing voltage $V_B$, and a limiting resistor $R_B$ through which a biasing current $I_B$ flows into the node 36. The biasing current $I_B$ forward biases the diode $D_D$, thereby providing a voltage of about 0.6 volts on the anode 50 of the diode $D_D$. The cathode 52 of the diode $D_D$ is connected to an appliance circuit in the trailer 14, also referred to herein as a second appliance circuit 54, such as the trailer's turn indicator light circuit, brake light circuit, or marker light circuit. The second appliance circuit 54 preferably includes a load or appliance 56, such as the turn indicator lights on the trailer 14, and a chassis ground 58 on the trailer 14.

As shown in FIG. 1, the second appliance circuit 54 receives power from the first appliance circuit 16 through the conductor 28, contact 32, conductor 34, and diode $D_D$. Thus, if the switching device 20 is in a closed position and the umbilical cable 26 is connected to the connector 30, the tractor appliance 22 and the trailer appliance 56 are activated. In a preferred embodiment, the switch 20 is a relay that intermittently cycles between open and closed positions to activate the appliances 22 and 56, such as is the case for emergency flashers or turn indicator lights.

As described in more detail below, the voltage level at the node 36 is indicative of whether or not the umbilical cable 26 is connected to the connector 30. Voltage conditions at the node 36 are discussed hereinafter for three different conditions: (1) umbilical cable 26 connected and switch 20 open; (2) umbilical 26 connected and switch 20 closed; and (3) umbilical 26 disconnected. Preferably, the comparator network 44 generates an output signal that is indicative of the voltage level on the node 36, and provides the output signal to a processor 60. Based on the output signal from the comparator network 44, the processor 60 provides an indication signal to a transmitter 62, such as a cellular telephone transmitter or satellite up-link transmitter. The transmitter 62 transmits the indication signal from an antenna 64, through the cellular or satellite network, to a central monitoring station.

It will be appreciated that the nature of the indication signal provided by the processor 60 may also be affected by other conditions of the trailer 14, such as temperature, load, door status, and location. These other conditions may be determined by sensors or receivers provided on the trailer that are also interfaced with the processor 60.

When the umbilical 26 is connected to the connector 30 and the switch 20 is open, the voltage level on the conductor 28 is at chassis ground potential or zero volts. In this situation, the biasing current $I_B$ flows from the node 36 through the conductors 34 and 28, and through the appliance 22 to the chassis ground 24. Thus, in this situation, the diode $D_D$ is not forward biased, and the voltage at the node 36 is zero volts.

When the umbilical 26 is connected to the connector 30 and the switch 20 is closed, the tractor appliance 22 is turned on and the voltage $V_S$ is on the conductor 28. Since the conductor 28 is contacting the contact 32, the voltage $V_S$ is also on the conductor 34 and on the node 36. The diode $D_D$ provides a small voltage drop, such as about 0.6 volts, which is insignificant compared to the 12–13 volts provided by the voltage source 18. Thus, the trailer appliance 56 is turned on by a voltage level of approximately $V_S$–0.6 volts. In the preferred embodiment, where the trailer appliance 56 is a turn indicator light circuit, the intensity of the indicator lights is not noticeably affected by the slight reduction in voltage caused by the diode $D_D$.

When the umbilical 26 is disconnected from the connector 30, the biasing current $I_B$ flows to the anode 50 of the diode $D_D$, thereby forward biasing the diode $D_D$. In a forward biased condition, the voltage drop across the diode $D_D$ is approximately 0.6–0.7 volts. Thus, with the umbilical 26 disconnected, the voltage level on the node 36 is about 0.6–0.7 volts.

To summarize the three possible conditions: (1) when the umbilical 26 is connected to the connector 30 and the switch 20 is open, the voltage level on the node 36 is about zero volts; (2) when the umbilical 26 is connected to the connector 30 and the switch 20 is closed, the voltage level on the node 36 is about 12–13 volts ($V_S$); and (3) when the umbilical 26 is disconnected from the connector 30, the voltage level on the node 36 is about 0.6 volts.

Figure 2:
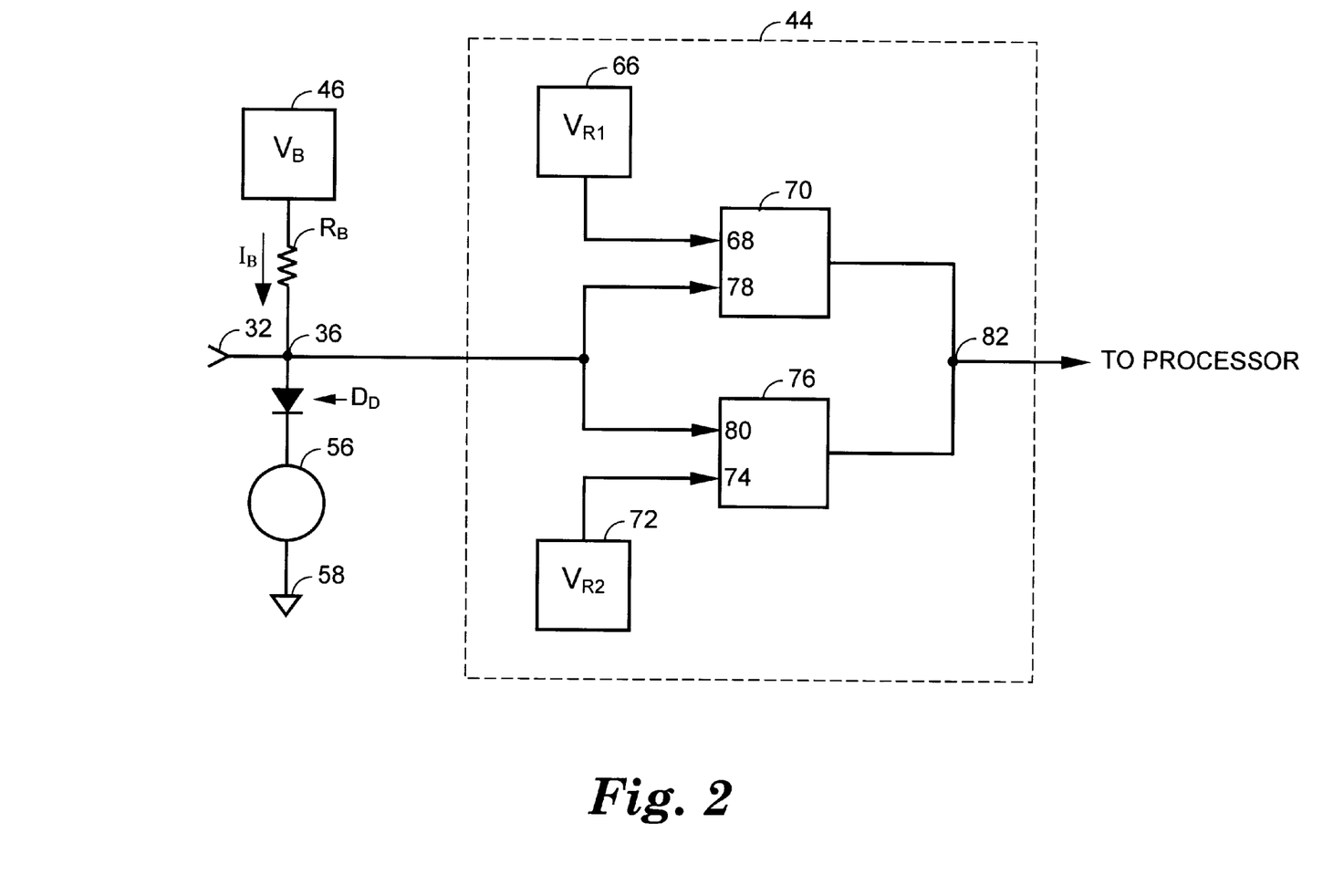
FIG. 2 is a functional block diagram of a comparison circuit according to a preferred embodiment of the invention.

FIG. 2 depicts a functional block diagram of the comparator network 44 for discriminating the voltage level on the node 36. The comparator network 44 includes a first to voltage source 66 for providing a first reference voltage $V_{R1}$ to a first input 68 of a first comparator circuit 70, and a second voltage source 72 for providing a second reference voltage $V_{R2}$ to a first input 74 of a second comparator circuit 76. In a preferred embodiment of the invention, the first reference voltage $V_{R1}$ is about 0.29 volts and the second reference voltage $V_{R2}$ is about 1.25 volts. The voltage level on the node 36 is coupled to second inputs 78 and 80 of the first and second comparator circuits 70 and 76, respectively. The outputs of the comparator circuits 70 and 76 are connected to a node 82.

The first comparator circuit 70 compares the first reference voltage $V_{R1}$ (0.29 volts) at the first input 68 to the voltage on the node 36 provided to the second input 78. The second comparator circuit 76 compares the second reference voltage $V_{R2}$ (1.25 volts) at the first input 74 to the voltage on the node 36 provided to the second input 80. When the voltage on the node 36 is greater than the first reference voltage $V_{R1}$ and less than the second reference voltage $V_{R2}$, the voltage level on the node 82 is approximately 0.6 volts. When the voltage on the node 36 is less than the first reference voltage $V_{R1}$, the voltage level on the node 82 is approximately 0 volts. When the voltage on the node 36 is greater than the second reference voltage $V_{R2}$, the voltage level on the node 82 is approximately 13–14volts.

As discussed above, when the umbilical 26 is connected to the connector 30 and the switch 20 is open, the voltage level on the node 36 is about zero volts. In this situation, since the voltage on the node 36 (0 volts) is less than the first reference voltage $V_{R1}$ (0.29 volts), the voltage level on the node 82 is approximately 0 volts. When the umbilical 26 is connected to the connector 30 and the switch 20 is closed, the voltage level on the node 36 is about 12—13 volts, and is thus greater than the second reference voltage $V_{R2}$ (1.25). In this situation, the voltage level on the node 82 is approximately 13–14volts. When the umbilical 26 is disconnected from the connector 30, the voltage level on the node 36 is about 0.6 volts, which falls between the first and second reference voltages $V_{R1}$ and $V_{R2}$. In that situation, the voltage level on the node 82 is approximately 0.6 volts.

Therefore, only when the voltage on the node 36 is between about 0.29 and 1.25 volts does the comparator network 44 provide an indication signal of 0.6 volts on the node 82, thereby indicating that the umbilical 26 has been disconnected from the connector 30. As long as the umbilical 26 is connected, the voltage on the node 82 remains at 0 or 13 volts, depending on the state of the switch 20.

Figure 3:
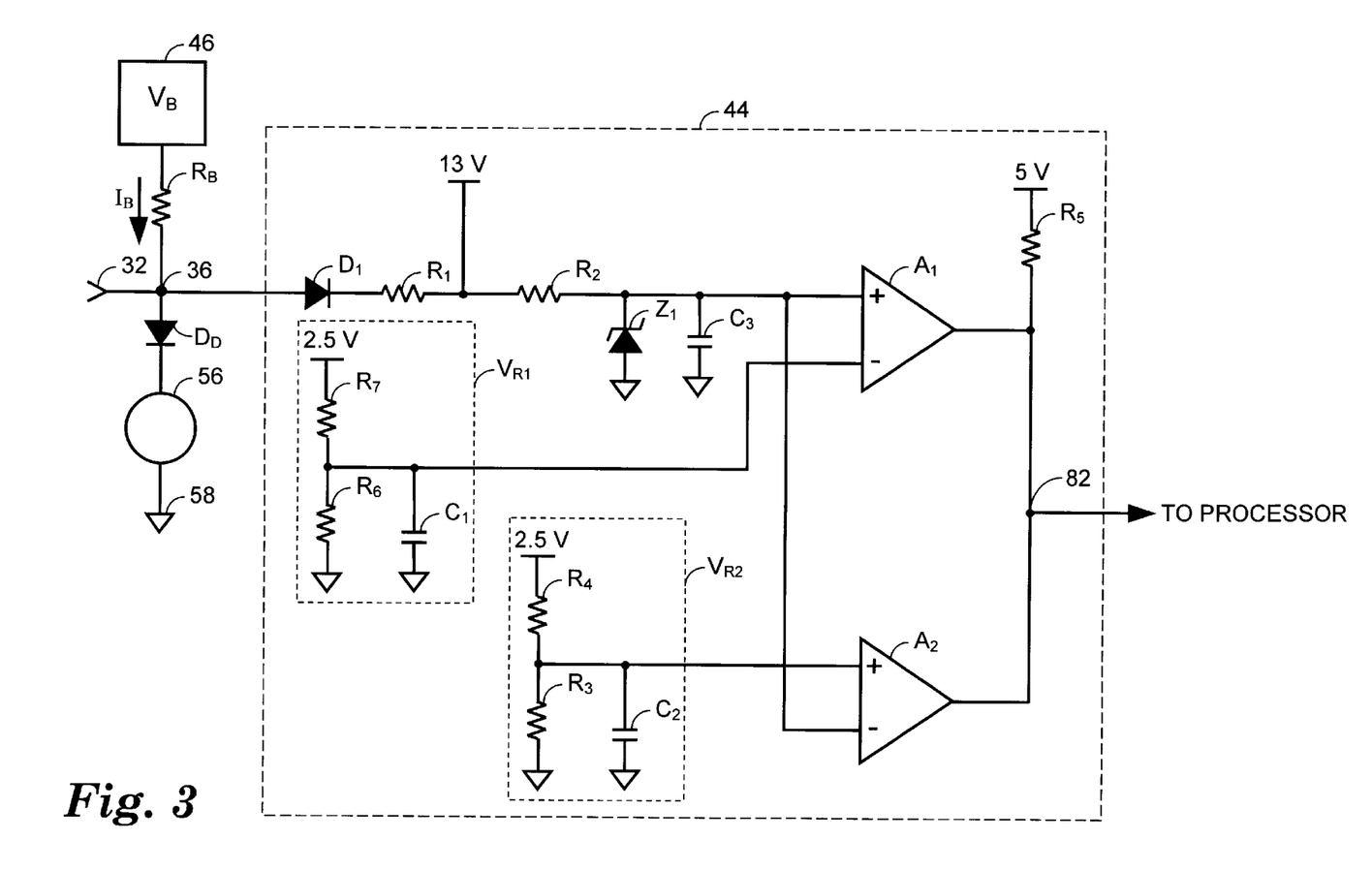
FIG. 3 is a schematic diagram of a detection circuit according to a preferred embodiment of the invention.

FIG. 3 depicts a preferred implementation of the comparator network 44. Preferred values or manufacturer part numbers of the various circuit components are listed below in Table I. It will be appreciated that the circuit depicted in FIG. 3 is merely an example of a preferred embodiment. Thus, the invention is not limited to any particular circuit implementation.

TABLE I

| Element | Value or Part Number |
| --- | --- |
| $R_1$ | 1 KΩ |
| $R_2$ | 100 KΩ |
| $R_3$ | 100 KΩ |
| $R_4$ | 100 KΩ |
| $R_5$ | 100 KΩ |
| $R_6$ | 100 KΩ |
| $R_7$ | 750 KΩ |
| $C_1$ | 0.1 µF |
| $C_2$ | 0.1 µF |
| $C_3$ | 0.1 µF |
| $Z_1$ | DZ23V300 |
| $D_D$ | 6A05 |
| $D_1$ | S2B |
| $A_1$ | LM2903D |
| $A_2$ | LM2903D |

Figure 4:
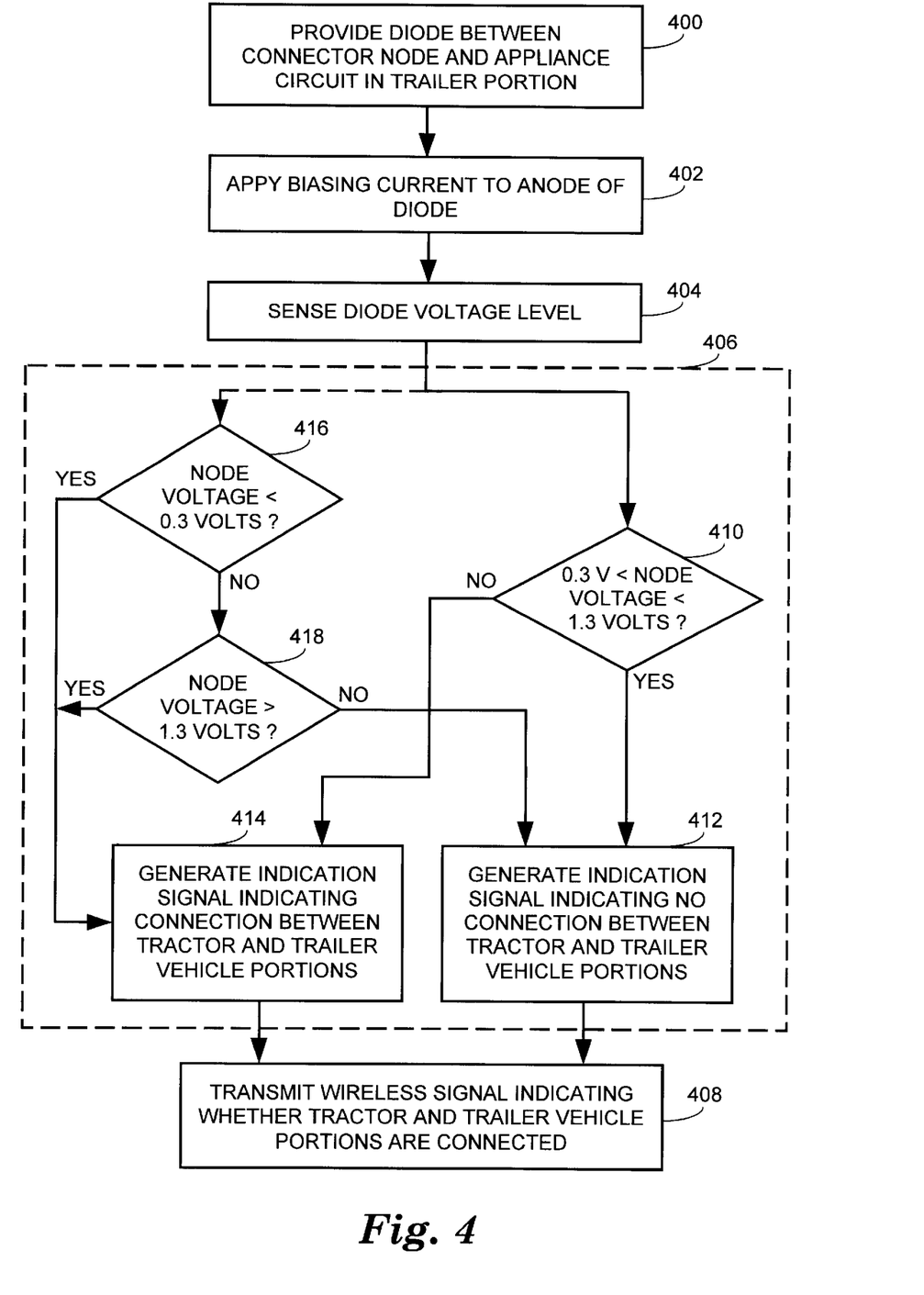
FIG. 4 depicts a method for detecting whether a first vehicle portion is connected to a second vehicle portion according to a preferred embodiment of the invention.

FIG. 4 depicts a method for detecting and reporting the connect/disconnect status of an electrical umbilical cable between a tractor and a trailer of a tractor-trailer rig using a system as shown in FIG. 1. As discussed above, the detection diode $D_D$ is provided between a connector node 36 and an appliance circuit 54, such as a turn indicator light circuit, in the trailer (step 400). A biasing current is applied to the anode 50 of the diode $D_D$ to forward bias the diode $D_D$ (step 402). The voltage level on the anode 50 is sensed, preferably using a comparator network 44 as depicted in FIGS. 2 and 3 (step 404). Based on the voltage level on the node 36, the comparator network 44 or the processor 60 generates an indication signal (step 406). A wireless signal is generated based on the indication signal, and is transmitted to a central monitoring station, such as by cellular or satellite transmission (step 408).

The generation of the indication signal (step 406) may be accomplished in several different ways, two of which are depicted in FIG. 4. According to the preferred embodiment, the voltage on the node 36 is compared to a first reference voltage and to a second reference voltage (step 410). If the voltage on the node 36 is greater than the first reference voltage (such as 0.3 V) and less than the second reference voltage (such as 1.3 volts), then an indication signal is generated indicating no connection between the tractor and the trailer of the vehicle (step 412). If the voltage on the node 36 is less than the first reference voltage or greater than the second reference voltage, then an indication signal is generated indicating that a connection exists between the tractor and the trailer of the vehicle (step 414).

In an alternative embodiment, also depicted in FIG. 4, the voltage on the node 36 is compared to the first reference voltage (step 416). If the voltage on the node 36 is less than the first reference voltage, then an indication signal is generated indicating that a connection exists between the tractor and the trailer of the vehicle (step 414). If the voltage on the node 36 is not less than the first reference voltage, then the voltage on the node 36 is compared to the second reference voltage (step 418). If the voltage on the node 36 is greater than the second reference voltage at step 418, then the indication signal is generated indicating that a connection exists between the tractor and the trailer of the vehicle (step 414). If the voltage on the node 36 is not greater than the second reference voltage at step 418, then the indication signal is generated indicating no connection exists between the tractor and the trailer of the vehicle (step 412).

It is contemplated, and will be apparent to those skilled in the art from the preceding description and the accompanying drawings that modifications and/or changes may be made in the embodiments of the invention. Accordingly, it is expressly intended that the foregoing description and the accompanying drawings are illustrative of preferred embodiments only, not limiting thereto, and that the true spirit and scope of the present invention be determined by reference to the appended claims.

What is claimed is:

1. An apparatus for detecting whether an electrical connection exists between a first vehicle portion and a second vehicle portion of a multi-portion vehicle, comprising:

a first chassis electrical ground in the first vehicle portion;

a first electrical conductor coupled to the first chassis electrical ground;

a second electrical conductor operable to electrically connect to and disconnect from the first electrical conductor;

a second vehicle chassis ground disposed in the second vehicle portion; and a detection circuit for providing an indication based upon whether an electrical connection exists between the first electrical conductor and the second electrical conductor, comprising:

a diode having:

an anode electrically connected to the second electrical conductor and having an anode voltage thereon, and a cathode electrically coupled to the second vehicle chassis ground;

a biasing-current source for providing a forward biasing current to the anode of the diode; and a comparison circuit for providing an output signal indicative of a voltage level at the anode of the diode, where the voltage level at the anode of the diode is dependent at least in part upon whether an electrical connection exists between the first electrical conductor and the second electrical conductor.

2. The apparatus of claim 1 wherein the first electrical conductor comprises a conductor within an umbilical cable for providing electrical connection between the first and second vehicle portions, and wherein the second electrical conductor comprises an electrical contact in a connector operable to receive the umbilical cable.

3. The apparatus of claim 1 wherein the biasing circuit further comprises:

a second voltage source for supplying a biasing voltage; and a limiting resistor electrically connected between the second voltage source and the anode of the diode.

4. The apparatus of claim 1 further comprising:

a first reference voltage source for providing a first reference voltage; and the comparison circuit for receiving at least the anode voltage and the first reference voltage, for providing the output signal having a first signal indication when the amplitude of the anode voltage is less than the first reference voltage, and for providing the output signal having a second signal indication when the amplitude of the anode voltage is greater than the first reference voltage.

5. The apparatus of claim 1 further comprising a second appliance circuit disposed in the second vehicle portion, the second appliance circuit comprising a second vehicle appliance electrically connected between the cathode of the diode and the second vehicle chassis ground.

6. The apparatus of claim 5 wherein the second vehicle appliance comprises one or more indicator lights on the second vehicle portion.

7. The apparatus of claim 1 further comprising:

a first appliance circuit disposed in the first vehicle portion, comprising in series:
 a first voltage source for supplying a first voltage;
 a switching device connected to the first voltage source;
 a first vehicle appliance connected to the switching device;
 the first vehicle chassis ground connected to the first vehicle appliance; and
the first electrical conductor connected to the first appliance circuit between the switching device and the first vehicle appliance.

8. The apparatus of claim 7 wherein the first vehicle appliance comprises one or more indicator lights on the first vehicle portion.

9. The apparatus of claim 7 further comprising:

a first reference voltage source for providing a first reference voltage;

a second reference voltage source for providing a second reference voltage having an amplitude greater than the first reference voltage; and the comparison circuit for receiving the anode voltage, the first reference voltage, and the second reference voltage, for providing the output signal having a first signal indication when the amplitude of the anode voltage is less than the first reference voltage, and for providing the output signal having a second signal indication when the amplitude of the anode voltage is between the amplitudes of the first and second reference voltages.

10. The apparatus of claim 9 wherein the comparison circuit is further operable to provide the output signal having a third signal indication when the amplitude of the anode voltage is greater than the amplitude of the second reference voltage.

11. The apparatus of claim 9 further comprising:

the first reference voltage source for providing the first reference voltage having an amplitude of no greater than about 0.3 volts; and the second reference voltage source for providing the second reference voltage having an amplitude of no less than about 1.3 volts.

12. The apparatus of claim 9 wherein:

the switching device is operable to connect the first vehicle appliance to the first voltage source when the switching device is in a first state, and operable to disconnect the first vehicle appliance from the first voltage source when the switching device is in a second state, and when a connection exists between the first electrical conductor and the second electrical conductor, the switching device is operable to connect the anode of the diode to the first voltage source when the switching device is in the first state and, and operable to disconnect the anode of the diode from the first voltage source when the switching device is in the second state.

13. The apparatus of claim 12 wherein:

the amplitude of the anode voltage is less than the amplitude of the first reference voltage when a connection exists between the first and second electrical conductors and the switching device is in the second state;

the amplitude of the anode voltage is greater than the amplitude of the second reference voltage when a connection exists between the first and second electrical conductors and the switching device is in the first state; and the amplitude of the anode voltage is between the amplitudes of the first and second reference voltages when no electrical connection exists between the first and second electrical conductors.

14. An apparatus for detecting whether an electrical connection exists between a first vehicle portion and a second vehicle portion of a multi-portion vehicle, comprising:

a first appliance circuit disposed in the first vehicle portion, comprising in series:
 a first voltage source for supplying a first voltage;
 a switching device connected to the first voltage source;
 a first vehicle appliance connected to the switching device; and
 a first vehicle chassis ground connected to the first vehicle appliance;

an umbilical cable for providing electrical connection between the first and second vehicle portions, the umbilical cable including a first electrical conductor connected to the first appliance circuit between the switching device and the first vehicle appliance;

a connector disposed on the second vehicle portion which is operable to receive the umbilical cable, the connector including therein second electrical conductor which is operable to electrically connect to and disconnect from the first electrical conductor;

a second vehicle chassis ground disposed in the second vehicle portion;

a detection circuit for providing an indication based upon whether an electrical connection exists between the first electrical conductor and the second electrical conductor, comprising:

a diode having:
an anode electrically connected to the second electrical conductor and having an anode voltage thereon, and
a cathode electrically coupled to the second vehicle chassis ground;

a biasing-current source for providing a forward biasing current to the anode of the diode; and a comparison circuit for providing an output signal indicative of a voltage level at the anode of the diode, where the voltage level at the anode of the diode is dependent at least in part upon whether an electrical connection exists between the first electrical conductor and the second electrical conductor; and a second appliance circuit disposed in the second vehicle portion, the second appliance circuit comprising a second vehicle appliance electrically connected between the cathode of the diode and the second vehicle chassis ground.

15. The apparatus of claim 14 further comprising:

a first reference voltage source for providing a first reference voltage;

a second reference voltage source for providing a second reference voltage having an amplitude greater than the first reference voltage; and the comparison circuit for receiving the anode voltage, the first reference voltage, and the second reference voltage, for providing the output signal having a first signal indication when the amplitude of the anode voltage is less than the first reference voltage, for providing the output signal having a second signal indication when the amplitude of the anode voltage is between the amplitudes of the first and second reference voltages, and for providing the output signal having a third signal indication when the amplitude of the anode voltage is greater than the amplitude of the second reference voltage.

16. An apparatus for detecting whether an electrical connection exists between a first vehicle portion and a second vehicle portion of a multi-portion vehicle, comprising:

a first appliance circuit disposed in the first vehicle portion, comprising in series:
a first voltage source for supplying a first voltage;
a switching device connected to the first voltage source;
a first vehicle appliance connected to the switching device; and
a first vehicle chassis ground connected to the first vehicle appliance;

a first electrical conductor coupled to the first chassis electrical ground;

a second electrical conductor operable to electrically connect to and disconnect from the first electrical conductor;

a second vehicle chassis ground disposed in the second vehicle portion;

a detection circuit for providing an indication based upon whether an electrical connection exists between the first electrical conductor and the second electrical conductor, comprising:

a diode having:
an anode electrically connected to the second electrical conductor and having an anode voltage thereon, and
a cathode electrically coupled to the second vehicle chassis ground;

a biasing-current source for providing a forward biasing current to the anode of the diode; and a comparison circuit for providing an output signal indicative of a voltage level at the anode of the diode, where the voltage level at the anode of the diode is dependent at least in part upon whether an electrical connection exists between the first electrical conductor and the second electrical conductor; and a second appliance circuit disposed in the second vehicle portion, the second appliance circuit comprising a second vehicle appliance electrically connected between the cathode of the diode and the second vehicle chassis ground, wherein:

the switching device is operable to connect the first vehicle appliance to the first voltage source when the switching device is in a first state, and operable to disconnect the first vehicle appliance from the first voltage source when the switching device is in a second state, and when a connection exists between the first electrical conductor and the second electrical conductor, the switching device is operable to connect the anode of the diode to the first voltage source when the switching device is in the first state and, and operable to disconnect the anode of the diode from the first voltage source when the switching device is in the second state.

17. The apparatus of claim 16 further comprising:

a first reference voltage source for providing a first reference voltage;

a second reference voltage source for providing a second reference voltage having an amplitude greater than the first reference voltage; and the comparison circuit for receiving the anode voltage, the first reference voltage, and the second reference voltage, for providing the output signal having a first signal indication when the amplitude of the anode voltage is less than the first reference voltage, for providing the output signal having a second signal indication when the amplitude of the anode voltage is between the amplitudes of the first and second reference voltages, and for providing the output signal having a third signal indication when the amplitude of the anode voltage is greater than the amplitude of the second reference voltage.

18. The apparatus of claim 17 wherein:

the amplitude of the anode voltage is less than the amplitude of the first reference voltage when a connection exists between the first and second electrical conductors and the switching device is in the second state;

the amplitude of the anode voltage is greater than the amplitude of the second reference voltage when a connection exists between the first and second electrical conductors and the switching device is in the first state; and the amplitude of the anode voltage is between the amplitudes of the first and second reference voltages when no electrical connection exists between the first and second electrical conductors.

19. A method for detecting whether an electrical connection exists between a first vehicle portion and a second vehicle portion of a multi-portion vehicle, comprising the steps of:

(a) sensing a node voltage level on an electrical node coupled to an appliance circuit in the second vehicle portion; and (b) generating an indication signal indicative of a relationship between the node voltage level, a first reference voltage level, and a second reference voltage level, where the indication signal indicates no electrical connection between the first and second vehicle portions when the node voltage level is greater than the first reference voltage level and less than the second reference voltage level, and where the indication signal indicates electrical connection between the first and second vehicle portions when the node voltage level is less than the first reference voltage level or greater than the second reference voltage level.

20. The method of claim 19 further comprising:

(c) providing a biasing device between the electrical node and the appliance circuit in the second vehicle portion; and (d) applying a biasing current to the biasing device.

21. The method of claim 19 further comprising transmitting a wireless signal to a central monitoring station to indicate whether the first and second vehicle portions are electrically connected, where the wireless signal is based on the indication signal.

22. The method of claim 19 wherein step (a) further comprises sensing a node voltage level of greater than about 1.3 volts when the first vehicle portion is electrically connected to the second vehicle portion and the appliance circuit in the second vehicle portion is activated by a voltage provided from the first vehicle portion.

23. The method of claim 19 wherein step (a) further comprises sensing a node voltage level of less than about 0.3 volts when the first vehicle portion is electrically connected to the second vehicle portion and the appliance circuit in the second vehicle portion is not activated by a, voltage provided from the first vehicle portion.

24. The method of claim 19 wherein step (a) further comprises sensing a node voltage level of between about 0.3 volts and 1.3 volts when the first vehicle portion is not electrically connected to the second vehicle portion.

* * * * *